US008094462B2

(12) United States Patent
Miyamoto et al.

(10) Patent No.: US 8,094,462 B2
(45) Date of Patent: Jan. 10, 2012

(54) HIGH FREQUENCY TUNER MODULE AND TUNER MODULE

(75) Inventors: Shozo Miyamoto, Katagami (JP); Makoto Abe, Katagami (JP)

(73) Assignee: Mitsumi Electric Co., Ltd., Tama-Shi (JP)

( * ) Notice: Subject to any disclaimer, the term of this patent is extended or adjusted under 35 U.S.C. 154(b) by 1077 days.

(21) Appl. No.: 11/998,136

(22) Filed: Nov. 28, 2007

(65) Prior Publication Data

US 2008/0174982 A1      Jul. 24, 2008

(30) Foreign Application Priority Data

Jan. 24, 2007  (JP) ................ 2007-013464

(51) Int. Cl.
*H05K 1/11* (2006.01)
*H05K 1/14* (2006.01)

(52) U.S. Cl. ............. 361/784; 361/782; 361/783

(58) Field of Classification Search ......... 361/782–784; 343/700 MS
See application file for complete search history.

(56) References Cited

U.S. PATENT DOCUMENTS 6,713,162 B2 * 3/2004 Takaya et al. .......... 428/209
6,809,688 B2 * 10/2004 Yamada .......... 343/700 MS

FOREIGN PATENT DOCUMENTS

JP          5-327230 A      12/1993

* cited by examiner

*Primary Examiner* — Tuan T Dinh
(74) *Attorney, Agent, or Firm* — Holtz, Holtz, Goodman & Chick, PC

(57) ABSTRACT

Disclosed is a high frequency tuner module, including: a circuit component; signal lines; a GND line; and a multilayer board formed by laminating a plurality of layers, wherein the circuit component is placed on a top layer surface of the multilayer board; the signal lines and the GND line are formed inside the multilayer board; and among the signal lines, high frequency signal transmitting signal lines to transmit a high frequency signal are formed on a single layer inside the multilayer board.

4 Claims, 3 Drawing Sheets

HIGH FREQUENCY TUNER MODULE AND TUNER MODULE

BACKGROUND OF THE INVENTION

1. Field of the Invention

The present invention relates to a high frequency tuner module and a tuner module, and more particularly a high frequency tuner module which can be integrated on a portable device and a tuner module including the high frequency tuner module.

2. Description of Related Art

In a tuner for receiving television signals, AM/FM broadcast signals and the like, a tuner module is configured with a single layer circuit board where a wiring pattern of signal lines, GND lines, etc. and circuit components are provided on both faces or one face of the board. Lately, in order to reduce size and thickness, enhance mounting density, etc. of the tuner module, tuner modules which use a multilayer board, formed by laminating a plurality of layers, have been developed in which circuit components, signal lines, etc. are placed on a surface of the top layer or inside the multilayer (for example, Japanese Patent Application Laid-open Publication No. 5-327230, hereinafter referred to as Patent Document 1).

A multilayer board preferably used in a tuner module is a board in which each of the laminated layer is formed by a board of low temperature co-fired ceramics (LTCC) whose base material is alumina.

As shown in FIG. 6A, a multilayer board comprising a tuner module M is formed by laminating a top layer L1 (also referred to as first layer L1), a second layer L1, a third layer L3, a fourth layer L4, and so on in this order. In the present specification, a surface of the tuner module M, i.e. a face of the top layer L1 open to outside is referred to as a top layer surface S1, and a signal line or the like formed in an area between the top layer L1 and the second layer L2, such as a signal line SL in the figure, is referred to as a signal line or the like formed on the second layer L2.

According to this representation, for example a GND line GL as shown in FIG. 6A is described as the GND line GL formed on the third layer L3. Also, in this case, the GND line GL is described as being formed on a layer directly below a layer on which a signal line SL is formed.

When high frequency tuner modules for receiving signals in high frequency bands such as television tuners for terrestrial digital broadcasting, tuners for wireless LAN or tuners for satellite radios in practice in the U.S. are configured with multilayer boards as described above in order to reduce the size of the module to be integrated on portable devices, there is a tendency that a loss of signal gain which occurs between the signal lines, the GND lines, and the circuit components become significant.

In a high frequency tuner module M, loss is compared between a case as shown in FIG. 6A, in which a signal line is provided on a layer L2 of the multilayer board laminated with layers L1, L2, L3, L4 and so on with a thickness of, for example, about 50 μm, and a solid GND line GL is provided on the layer L3 directly below the layer L2, and a case as shown in FIG. 6B, in which a solid GND line GL is provided on the layer L4 which is one layer apart from the layer L2 formed with the signal line SL. As shown in the graph in FIG. 7, as the frequency becomes higher, the loss becomes greater. Further, the loss becomes greater when the distance between the lines is small as in FIG. 6A than when the distance between the lines is large as in FIG. 6B.

It is considered this is because a section including a layer of an insulator and two lines bears a characteristic of a condenser and this section functions like a low pass filter with a condenser connecting the two lines. Thus, loss of signal gain occurs by the same mechanism as the insertion loss of a low pass filter.

The capacitance of the condenser is represented by the following formula, where a capacitance of the condenser is C, a permittivity of the insulator is $\epsilon$, an area of the facing conductors is S and a distance between the facing conductors is D, $$C = \epsilon \times S/D \tag{1}$$

Therefore, as described above, the smaller the distance between the lines become, the larger the capacitance C becomes. As a result, it is considered, the loss shown in curve A in FIG. 7, in which the distance between the lines is close, is greater than that of curve B, in which the distance is far.

The loss of signal gain does not only occur between lines inside the multilayer board as shown in FIG. 6A and FIG. 6B, but also may occur between wires placed on the top layer surface S1 of the multilayer board, and between the lines and the circuit components. Therefore, in a multilayer board which carries lines such as signal lines and GND lines and circuit components on the top layer surface S1 as shown in patent document 1, in order to reduce the loss of the signal gain, there needs to be at least a certain distance between the lines and between the lines and the circuit components on the top layer surface S1.

As described above, the multilayer board described in patent document 1 has the circuit components and the lines both placed on the top layer surface, thus the area of the top layer surface needs to be large enough to leave a certain distance between the circuit components and the lines. Therefore, with the multilayer board of the patent document 1, the area of the top layer surface cannot be smaller than a predetermined area, and the size of the tuner module, etc. as described above may not be sufficiently reduced.

SUMMARY OF THE INVENTION

It is, therefore, a main object of the present invention to provide a high frequency tuner module and a tuner module integrated with the same in which the size and thickness may be reduced, the loading density may be enhanced, and the loss of signal gain which occurs between the lines or between the lines and the circuit components may be prevented or reduced.

According to a first aspect of the present invention, there is provided a high frequency tuner module, comprising:
a circuit component;
signal lines;
a GND line; and
a multilayer board formed by laminating a plurality of layers, wherein
the circuit component is placed on a top layer surface of the multilayer board;
the signal lines and the GND line are formed inside the multilayer board; and
among the signal lines, high frequency signal transmitting signal lines to transmit a high frequency signal are formed on a single layer inside the multilayer board.

According to a second aspect of the present invention, there is provided a tuner module comprising:
a multilayer board including the high frequency tuner module of the first aspect, wherein:
the high frequency tuner module is formed in a spatial portion which is a part of the multilayer board and includes a part of a top layer surface of the tuner module as a top layer surface of the spatial portion; and a signal line which is to transmit a lower frequency signal lower than the high frequency signal is formed on a layer or a spatial portion other than the spatial portion of the high frequency tuner module.

BRIEF DESCRIPTION OF THE DRAWINGS

The above and other objects, advantages, and features of the present invention will become more fully understood from the detailed description given hereinbelow and the appended drawings which are given by way of illustration only, and thus are not intended as a definition of the limits of the present invention, wherein:

FIG. 6B is a schematic view showing a layout of a signal line and a GND line in a multilayer board when the GND line is provided with a layer between the layer on which the GND line is on and the layer on which the signal line is on.

DESCRIPTION OF THE PREFERRED EMBODIMENTS

A high frequency tuner module and a tuner module integrated with the high frequency tuner module of the present embodiment will be explained with reference to the drawings.

Figure 1:
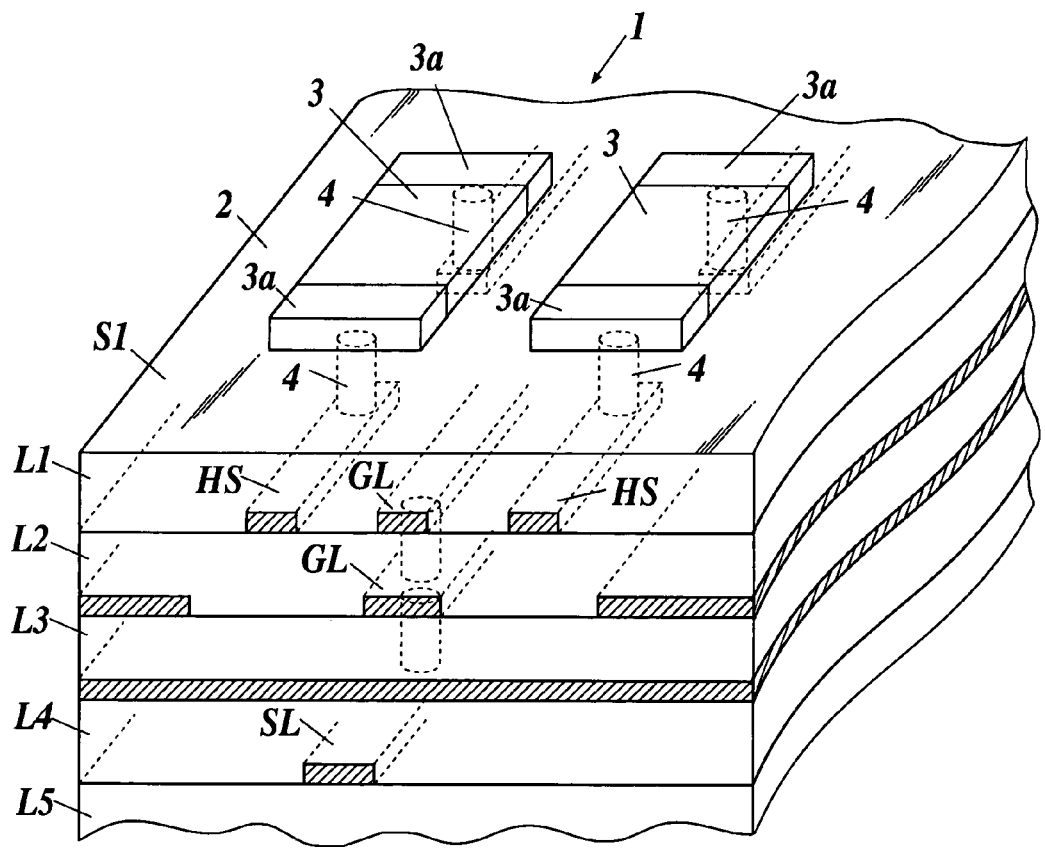
FIG. 1 is a schematic view showing a structure of a high frequency tuner module of the present embodiment.

A high frequency tuner module of the present embodiment is explained. As shown in FIG. 1, a high frequency tuner module 1 comprises a multilayer board 2 composed by laminating a plurality of layers L1, L2, L3, L4, L5 and so on. In the embodiment, each layer of the multilayer board 2 is formed with low temperature co-fired ceramics in which a thickness is about 50 μm and a base material is alumina. The number of the layers of the multilayer board 2 may be determined optionally.

Circuit components 3 such as tuner IC and various elements are mounted on a top surface S1 of a first layer L1 in the multilayer board 2. In the embodiment, circuit components 3 are not formed inside the multilayer board 2, that is, the inside of the multilayer board 2 is not provided with internal components, and all of the circuit components 3 are mounted on the top layer surface S1.

Figure 2:
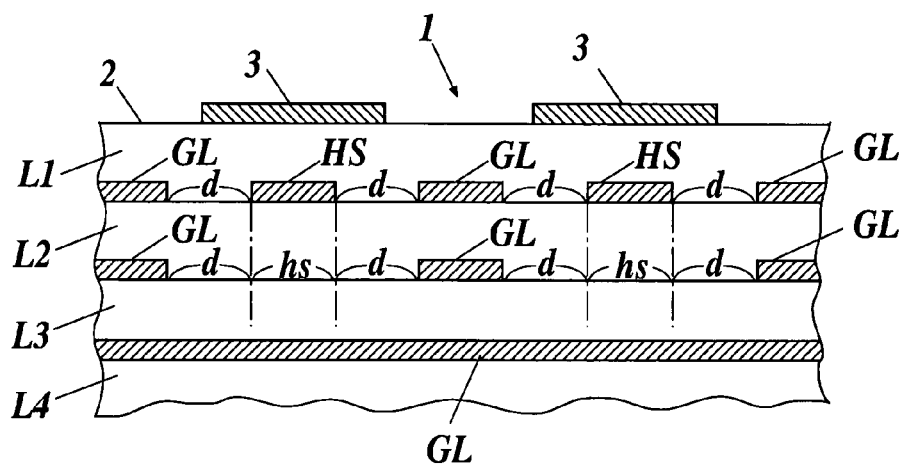
FIG. 2 is a schematic sectional view showing a layout of signal lines and GND lines in a multilayer board.

Signal lines SL including later-described high frequency signal lines HS and GND lines GL are formed on the second layer L2 or lower layers of the multilayer board 2. That is, signal lines SL and GND lines GL are formed only inside the multilayer board 2, and are not formed on the top layer surface S1. FIG. 1 and the later-described FIG. 2 show a solid GND line GL formed on the fourth layer L4, and it is not limited the fourth layer L4 is formed as the solid GND line GL, and whether to provide a solid GND line GL or on which layer the line is to be provided may be designed optionally.

Among the signal lines SL, the signal lines HS, which transmit signals with high frequencies (high frequency signals) of such as terrestrial digital broadcasting, wireless LAN and satellite radios, are formed on a single layer inside the multilayer board 2, and in this embodiment, the lines are formed only on the second layer L2 directly below the top layer surface S1 of the multilayer board 2. Herein below, the signal lines HS which transmit high frequency signals will be referred to as high frequency signal lines HS.

The high frequency signal lines HS are connected to a predetermined input-output terminal 3a of the circuit components 3 on the top layer surface S1 through a via hole 4 formed on the first layer L1.

In this embodiment, the GND lines GL are placed between the adjacent high frequency signal lines HS on the second layer L2 of the multilayer board 2. The distance between the high frequency signal line HS and the GND line GL is to be about 50 to 200 μm so that the loss of signal gain may be sufficiently reduced.

The signal lines SL other than the GND lines GL and high frequency signal lines HS are formed on the third layer L3 or lower layers on the multilayer board 2.

When the GND lines GL are formed on a layer directly below a layer on which the high frequency signal lines HS are formed, that is, in this embodiment, on the third layer L3 directly below the second layer L2 on which the high frequency signal lines HS are formed, the GND lines GL are not formed in the areas of the third layer L3 which are areas below the high frequency signal lines HS formed on the second layer L2.

Specifically, as shown in FIG. 2, among the areas of the third layer L3 in the multilayer board 2, not only are the GND lines GL not formed in areas hs directly below the high frequency signal lines HS formed on the second layer L2, but also the GND lines GL are formed at a pre-described distance, that is, a distance d about 50 to 200 μm from the edge of the areas hs directly below the high frequency signal lines HS.

When each layer of the multilayer board 2 has a sufficient thickness, and a sufficient distance can be obtained between the lines even when the GND lines GL are provided on a layer directly below the high frequency signal lines HS, the GND lines GL may be provided on a layer directly below the high frequency signal lines HS in the areas below the high frequency signal lines HS.

Next the operation of the high frequency tuner module 1 according to an embodiment of the present invention is described.

In the high frequency tuner module 1, only the circuit components 3 are provided on the top layer surface S1 of the multilayer board 2, and the signal lines SL including the high frequency signal lines HS and GND lines GL are not provided.

Figure 3A:
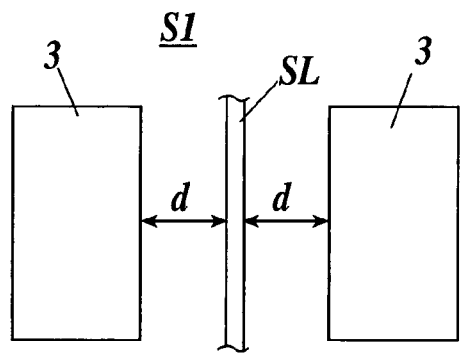
FIG. 3A is a schematic view showing distances between circuit components on a top layer surface, when a signal line is placed between the components.

As shown in FIG. 3A, for example, if the signal line SL is provided along with the circuit components 3 on the top layer surface S1, it is necessary to provide the distance d between the circuit components 3 and the signal line SL in order to reduce the loss of signal gain or to prevent interference or coupling of the signals as described above, and the distance between the circuit components 3 needs to be at least the sum of twice the distance d and the width of the signal line SL.

Figure 3B:
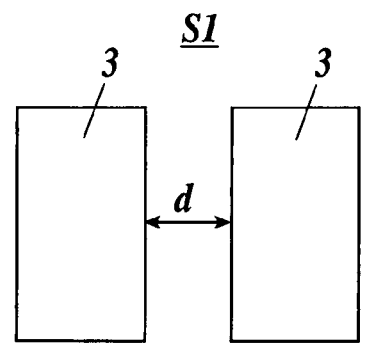
FIG. 3B is a schematic view showing a distance between circuit components on a top layer surface of the present embodiment.

Alternatively, as in this embodiment, if the signal lines SL and the GND lines GL are not provided on the top layer surface S1, the circuit components 3 may be as close to each other as the distance d as shown in FIG. 3B, and the area necessary for placing the circuit components 3 on the top layer surface S1 of the multilayer board 2 may be made smaller by the closer distance.

In the high frequency tuner module 1, as shown in FIG. 1 and FIG. 2, the high frequency signal lines HS are formed on a single layer inside the multilayer board 2.

Figure 4A:
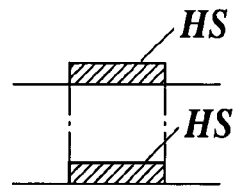
FIG. 4A is a schematic view showing a layout of high frequency signal lines in a multilayer board when the lines are placed overlapping in a vertical direction.

As shown in FIG. 4A, if two high frequency signal lines HS are formed on different layers of the multilayer board 2 with overlapping in a vertical direction, the area of the facing parts of the high frequency signal lines HS becomes large and the signals easily interfere and couple with each other.

Figure 4B:
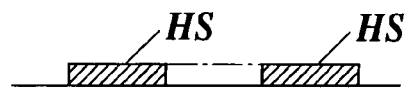
FIG. 4B is a schematic view showing a layout of high frequency signal lines in a multilayer board of the present embodiment.

Alternatively, the high frequency signal lines HS of this embodiment as shown in FIG. 4B, are formed on the single layer, thus the area of the parts facing with each other becomes small, which reduces the possibility of coupling and interference of the signals so that the interference and coupling of the signals do not substantially occur. In this embodiment, by placing GND lines GL between adjacent high frequency signal lines HS on the single layer, such interference and coupling of the signals may surely be prevented.

As described above, when the GND lines GL are formed directly below the high frequency signal lines HS, the structure composed of these lines have a characteristic of a condenser and loss of signal gain occurs. In this embodiment, when the GND lines GL are formed on the layer directly below the layer on which the high frequency signal lines HS are formed, the GND lines GL are not formed in the areas below the high frequency signal lines HS, thus the loss of signal gain does not occur.

As described above, according to the high frequency tuner module 1 of the present embodiment, the loss of the signal gain which occurs between the lines and between the lines and the circuit components may surely be prevented or reduced.

Also, at the same time, the distance between the circuit components on the top layer surface of the multilayer board comprising the high frequency tuner module may be shortened. Consequently, the area of the top layer surface on which the circuit components are placed may be made sufficiently smaller, and the high frequency tuner module may be made small and thin enough to be integrated on a portable device and the like, and the loading density can be enhanced.

Next, a tuner module integrated with the high frequency tuner module 1 of the embodiment of the present embodiment is described.

Figure 5:
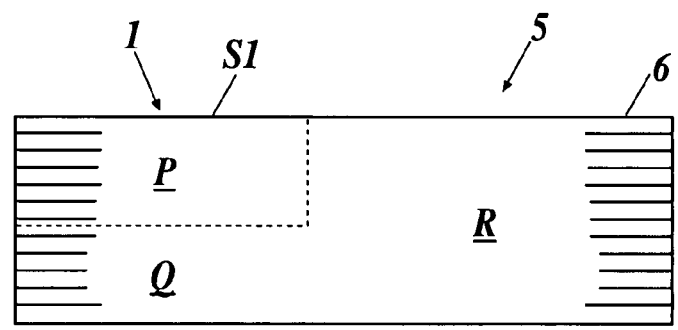
FIG. 5 is a schematic view showing a spatial portion in which a high frequency tuner module is integrated in a tuner module.
Figure 6A:
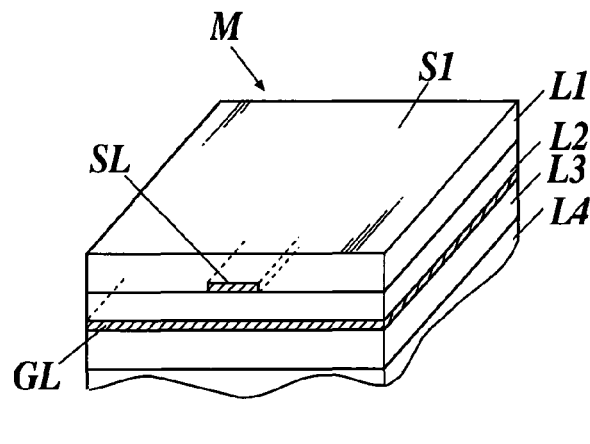
FIG. 6A is a schematic view showing a layout of a signal line and a GND line in a multilayer board when a GND line is provided on a layer directly below a signal line.
Figure 6B:
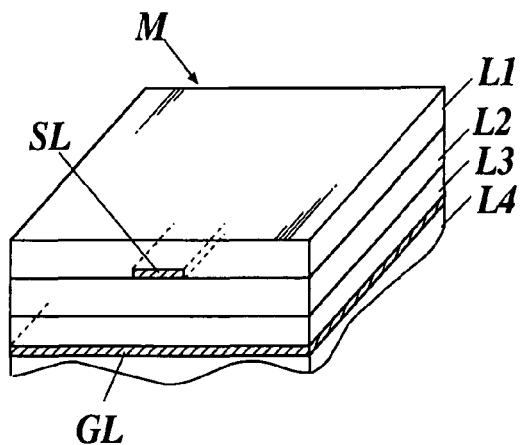
Figure 7:
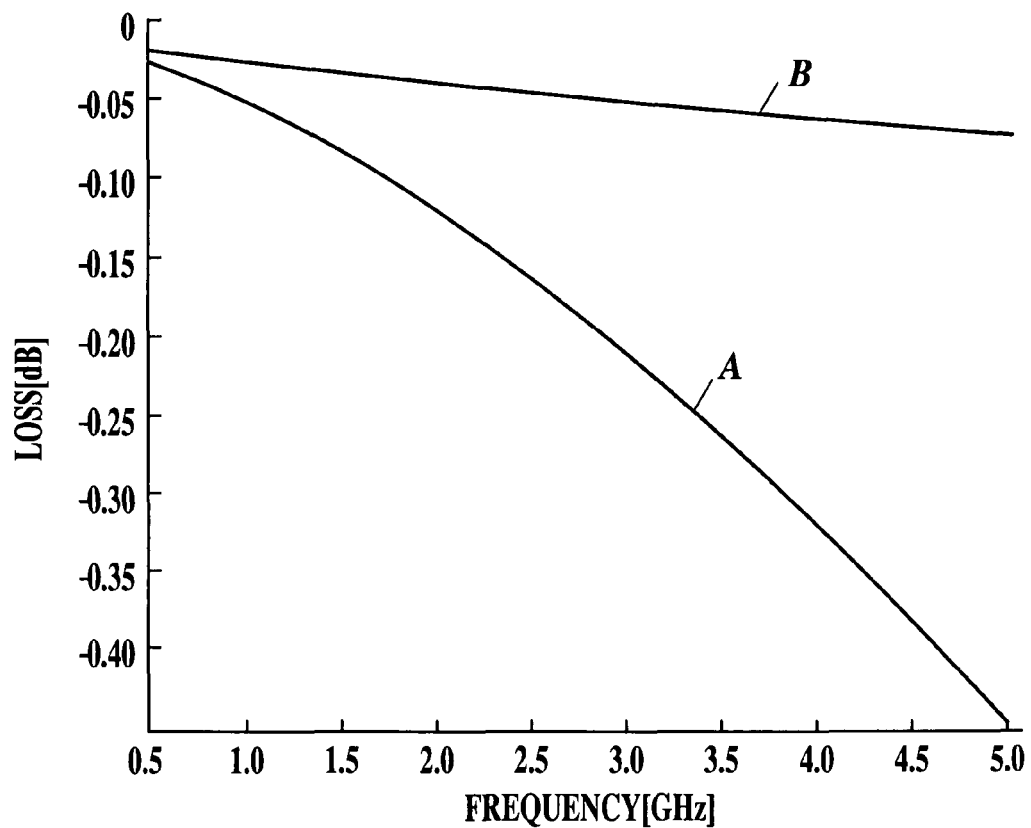
FIG. 7 is a graph showing the relationship between loss of signal gain and frequency according to the layout of FIGS. 6A and 6B.

The above described high frequency tuner module 1 may be an independent configuration, or also may be an integrated configuration integrated on a tuner module which processes intermediate frequency (IF) signals of a MHz band with a lower frequency. In this case, as shown in FIG. 5 in an area P partitioned by broken lines, the high frequency module 1 is formed in the spatial portion P which is a part of the tuner module 5 comprising multilayer board 6.

It is preferable that the high frequency tuner module 1 includes a part of the top layer surface of the tuner module 5 as the top layer surface S1 so that the above-described structure can be maintained and the advantages may be effectively obtained. That is, it is preferable that an area of the top layer surface of the tuner module 5 is reserved, the circuit components 3 are placed in the area thereof, and the signal lines, etc. are not placed in the area thereof.

It is preferable that in the tuner module 5, the signal line (not shown), which transmits signals with lower frequencies than high frequency signal line HS of the high frequency tuner module 1, is formed on a layer other than the spatial portion of the high frequency tuner module 1 such as the area Q below the area P shown in FIG. 5 or a spatial portion other than the spatial portion P of the high frequency tuner module 1 such as area R shown in FIG. 5.

With such structures, the above-described high frequency tuner module 1 may be formed inside the tuner module 5 optionally and the above-described advantages of the high frequency tuner module 1 may be obtained effectively.

By forming the signal lines, which transmit signals with lower frequencies than the high frequency signal lines HS, in an area other than the spatial portion of the high frequency tuner module 1, the interference between the high frequency signal lines HS and the signal lines which transmit low frequency signals may be prevented, and the coupling of the signals, and the loss of signal gain may surely be prevented.

Because the size of the high frequency tuner module 1 may be reduced, the size of the whole tuner module 5 which loads the high frequency tuner module 1 may be reduced.

According to a first aspect of the preferred embodiments of the present invention, there is provided a high frequency tuner module, comprising:
a circuit component;
signal lines;
a GND line; and
a multilayer board formed by laminating a plurality of layers, wherein
the circuit component is placed on a top layer surface of the multilayer board;
the signal lines and the GND line are formed inside the multilayer board; and
among the signal lines, high frequency signal transmitting signal lines to transmit a high frequency signal are formed on a single layer inside the multilayer board.

Here, the high frequency signal is a signal with a frequency between 100 MHz and 100 GHz.

According to the first aspect, the signal lines are not provided on the top layer surface of the multilayer board comprising the high frequency tuner module, and only the circuit components are placed. If the signal lines are placed between the circuit components as shown in FIG. 3A as described above, it is necessary to provide a distance between the signal lines and the circuit components in order to reduce the loss of signal gain and prevent the interference and coupling of the signals. Alternatively, if the signal lines are not provided as shown in FIG. 3B, the distance between the circuit components may be shortened.

Thus, the area of the top layer surface on which the circuit components are placed may be made sufficiently smaller. This enables the high frequency tuner module to become small and thin enough to be integrated on a portable device, and may enhance the loading density The signal lines and the GND lines may be formed with sufficient distances inside the multilayer board, and by forming the signal lines, which transmit high frequencies, on a single layer, the possibility of the interference and coupling of the signals may be sufficiently reduced and the loss of signal gain which occurs between the lines and between the lines and the circuit components may be surely prevented or reduced.

Preferably, in the high frequency tuner module of the first aspect, the high frequency signal transmitting signal lines are formed on a layer directly below the top layer among the layers of the multilayer board.

By the above feature, among the layers of the multilayer board, by forming the signal lines which transmit high frequency signals on the second layer directly below the top layer surface, the signal lines which transmit the high frequency signals and the circuit components on the top layer surface may be connected at the shortest distance and a via hole for connection may be easily formed, the loss may be suppressed to the least amount, and the intervention with other lines which increases as the connecting lines become longer may be suppressed.

Preferably, the GND line is placed between adjacent two lines of the high frequency signal transmitting signal lines.

By the above feature, the GND lines are placed between adjacent signal lines which transmit high frequency signals. Consequently, the interference and the coupling of the signals between the adjacent signal lines, which transmit high frequency signals, on the single layer may be surely prevented, and the advantages of the above features may be realized adequately.

Preferably, in the high frequency tuner module of the first aspect, the GND line is formed on a layer directly below a layer on which the high frequency signal transmitting signal line is formed, and the GND line is formed in an area other than an area directly below the high frequency signal transmitting signal line.

By the above feature, the GND lines are not formed in an area below the signal line which transmits high frequency signals. Consequently, the loss of signal gain which occurs when the signal lines and the GND lines directly below the signal lines configure a condenser and function as a low pass filter may be prevented, and the advantages of the above features of the present invention may be realized adequately.

According to a second aspect of the preferred embodiments of the present invention, there is provided a tuner module comprising:

a multilayer board including the high frequency tuner module of the first aspect, wherein:

the high frequency tuner module is formed in a spatial portion which is a part of the multilayer board and includes a part of a top layer surface of the tuner module as a top layer surface of the spatial portion; and a signal line which is to transmit a lower frequency signal lower than the high frequency signal is formed on a layer or a spatial portion other than the spatial portion of the high frequency tuner module.

According to the second aspect, in the tuner module which is integrated with the high frequency tuner module, a part of the top layer surface is used as the top layer surface of the high frequency tuner module, and signal lines which transmit lower frequency signals than other lines are not placed in the spatial portion for the high frequency tuner module. Consequently, the high frequency tuner module may be formed inside the tuner module optionally and the advantages may be obtained adequately.

Also, at the same time, the coupling of the signals caused by the interference between the signal lines which transmit high frequency signals and the signal lines which transmit lower frequency signals than the other lines and the loss of signal gain may surely be prevented. The size of the high frequency tuner module is reduced, thus the size of the whole tuner module which loads the high frequency tuner module may be reduced.

The entire disclosure of Japanese Patent Application No. 2007-013464 filed on Jan. 24, 2007 including description, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A high frequency tuner module, comprising:
    a circuit component; signal lines including high frequency signal transmitting signal lines to transmit a high frequency signal;
    a GND line; and
    a multilayer board comprising a plurality of laminated layers, wherein the circuit component is arranged on a top layer surface of the multilayer board;
    the signal lines and the GND line are arranged inside the multilayer board; the high frequency signal transmitting signal lines arranged on a same single layer inside the multilayer board and
    the GND line is arranged between two adjacent high frequency signal transmitting signal lines on said same single layer, and
    further comprising another GND line arranged on a layer directly below the layer on which the high frequency signal transmitting signal lines are arranged, wherein said another GND line is arranged in an area other than areas directly below the high frequency signal transmitting signal lines.

2. The high frequency tuner module according to claim 1, wherein the high frequency signal transmitting signal lines are arranged on a layer directly below a top layer among the layers of the multilayer board.

3. The high frequency tuner module according to claim 1, wherein the high frequency signal is a signal with a frequency between approximately 100 MHz and approximately 100 GHz.

4. A tuner module comprising:
    a multilayer board including the high frequency tuner module of claim 1;
    wherein:
    the high frequency tuner module is provided in a spatial portion which is a part of the multilayer board and includes a part of a top layer surface of the tuner module as the top layer surface on which the circuit component of the high frequency tuner module is arranged; and
    a signal line which is to transmit a lower frequency signal lower than the high frequency signal is arranged on a layer or a spatial portion other than the spatial portion of the high frequency tuner module.

* * * * *